United States Patent
Chromczak et al.

(10) Patent No.: US 10,879,903 B2
(45) Date of Patent: Dec. 29, 2020

(54) DISTRIBUTED I/O INTERFACES IN MODULARIZED INTEGRATED CIRCUIT DEVICES

(71) Applicant: Intel Corporation, Santa Clara, CA (US)

(72) Inventors: Jeffrey Chromczak, Toronto (CA); Paul Rotker, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/456,491

(22) Filed: Jun. 28, 2019

(65) Prior Publication Data

US 2019/0319627 A1 Oct. 17, 2019

(51) Int. Cl.
| | | |
|---|---|---|
| H03K 19/177 | (2020.01) | |
| H03K 19/17724 | (2020.01) | |
| H01L 23/00 | (2006.01) | |
| H01L 27/02 | (2006.01) | |
| H01L 25/065 | (2006.01) | |

(52) U.S. Cl.
CPC ....... H03K 19/17724 (2013.01); H01L 24/16 (2013.01); H01L 25/0655 (2013.01); H01L 27/0255 (2013.01); *H01L 2224/16225* (2013.01); *H01L 2924/1431* (2013.01)

(58) Field of Classification Search
CPC .............. H03K 19/17724; H01L 24/16; H01L 25/0655; H01L 27/0255; H01L 2224/16225; H01L 2924/1431
See application file for complete search history.

(56) References Cited

U.S. PATENT DOCUMENTS

| | | | | |
|---|---|---|---|---|
| 5,801,546 A | * | 9/1998 | Pierce | H03K 19/1737 326/39 |
| 5,883,525 A | * | 3/1999 | Tavana | H03K 19/17704 326/39 |
| 7,084,487 B1 | * | 8/2006 | Conn | H01L 24/73 257/660 |
| 7,759,968 B1 | * | 7/2010 | Hussein | H03K 19/17764 326/38 |
| 9,099,999 B1 | * | 8/2015 | Wang | H03K 17/00 |
| 9,859,896 B1 | * | 1/2018 | Gaide | H03K 19/17744 |
| 9,911,465 B1 | * | 3/2018 | Camarota | G11C 5/025 |
| 10,038,647 B1 | * | 7/2018 | Lesea | H04L 49/109 |
| 2003/0089977 A1 | * | 5/2003 | Chee | H01L 25/105 257/723 |
| 2005/0007147 A1 | * | 1/2005 | Young | H01L 27/0207 326/41 |
| 2008/0144243 A1 | * | 6/2008 | Mariani | G01R 31/71 361/56 |

(Continued)

*Primary Examiner* — Kurtis R Bahr
(74) *Attorney, Agent, or Firm* — Fletcher Yoder, P.C.

(57) ABSTRACT

An integrated circuit device is disclosed that includes an interposer and a programmable fabric die disposed on the interposer. The programmable fabric die includes multiple sectors that each have multiple rows of logic element blocks. Each row of logic element blocks includes multiple microbumps. Each logic element block has programmable fabric circuitry and an input/output interface electrically coupled to a respective microbump. The integrated circuit device also includes a device disposed on the interposer external to the programmable fabric die and electrically coupled to the microbumps via the interposer.

22 Claims, 8 Drawing Sheets

(56) References Cited

U.S. PATENT DOCUMENTS

| | | | |
|---|---|---|---|
| 2011/0239456 A1* | 10/2011 | Conn | H01L 24/81 |
| | | | 29/840 |
| 2012/0147567 A1* | 6/2012 | Lee | H01L 25/18 |
| | | | 361/729 |
| 2013/0159587 A1* | 6/2013 | Nygren | G11C 5/063 |
| | | | 710/306 |
| 2014/0049932 A1* | 2/2014 | Camarota | H01L 25/0652 |
| | | | 361/807 |
| 2014/0177626 A1* | 6/2014 | Thottethodi | H01L 23/49838 |
| | | | 370/351 |
| 2018/0047663 A1* | 2/2018 | Camarota | H01L 23/5384 |
| 2018/0358313 A1* | 12/2018 | Newman | G06F 13/20 |

* cited by examiner

DISTRIBUTED I/O INTERFACES IN MODULARIZED INTEGRATED CIRCUIT DEVICES

BACKGROUND

The present disclosure relates to connectivity of a die of an integrated circuit system, such as between a programmable fabric die and an input/output component or another programmable fabric die of a modularized integrated circuit system.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Modern electronics, such as computers, portable devices, network routers, data centers, Internet-connected appliances, and more, tend to include at least one integrated circuit device. Integrated circuit devices may take on a variety of forms, including processors (e.g., central processing units (CPUs)), memory devices, and programmable devices (e.g., FPGA), to name a few examples. The programmable devices, in particular, may include a programmable fabric of logic that may be programmed (e.g., configured) and reprogrammed (e.g., reconfigured) after manufacturing to provide a wide variety of functionality based on a circuit design.

To enable a programmable fabric die of the programmable device to communicate with other devices or components (e.g., internal or external to the programmable device), the programmable fabric die may include a number of input/output (I/O) interfaces (e.g., microbumps and/or associated transmission, receiving, driving, and/or routing components). Typically, the I/O interfaces may be aggregated in regions (e.g., columns or clusters) of the programmable fabric die. However, aggregating the I/O interfaces may result in routing congestion and/or communication delay, possibly decreasing operational efficiency of the programmable device.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

Integrated circuits, such as field-programmable gate arrays (FPGAs), may include one or more programmable fabric dies having programmable fabric (e.g., logic array blocks (LABs), having logic elements such as digital signal processing (DSP) blocks, routing multiplexers (muxes), and so on) that may be configured and, in some cases, later reconfigured to realize a circuit design. To enable a programmable fabric die to communicate with other devices or components, the programmable fabric die may include a number of input/output (I/O) interfaces (e.g., microbumps and/or associated transmission, receiving, driving, and/or routing components). The presently disclosed programmable fabric die includes I/O interfaces that are distributed across programmable fabric of the die, rather than clustered or aggregated in one or more regions of the die. For example, multiple logic elements of the programmable fabric of the programmable fabric die may each include one or more I/O interfaces, as opposed to aggregating the I/O interfaces in regions (e.g., columns or clusters) of the programmable fabric die. In this manner, information or signals to be sent to and from the I/O interfaces may not need to first be sent to an aggregated I/O interface region, decreasing routing congestion in the programmable fabric die. Moreover, communication delay resulting from sending information or signals to or from portions of the programmable fabric die that are located further away from the aggregated I/O interface region (e.g., on an edge or peripheral portion of the programmable fabric die) may be decreased or avoided entirely.

Figure 1:
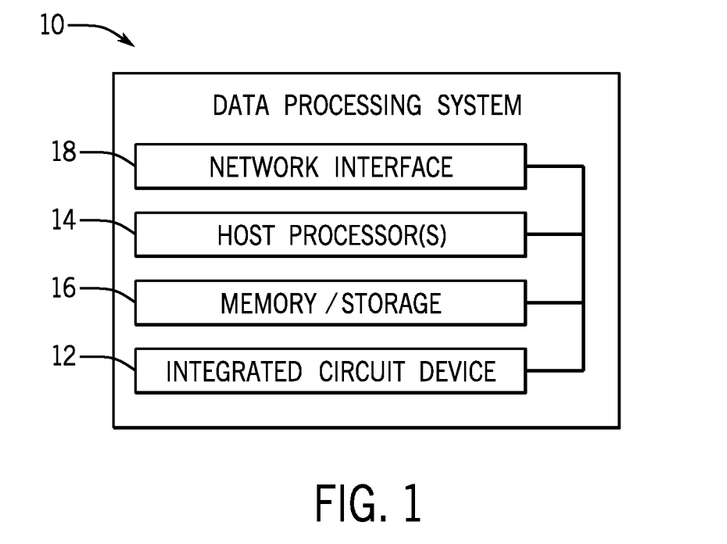
FIG. 1 is a block diagram of a data processing system including an integrated circuit device, according to embodiments of the present disclosure.

With the foregoing in mind, FIG. 1 is a block diagram of a data processing system 10 including an integrated circuit device 12, according to embodiments of the present disclosure. The data processing system 10 may include more or fewer components (e.g., including electronic display, user interface structures, application specific integrated circuits (ASICs)) than shown. The data processing system 10 may include one or more host processors 14, such as an INTEL® Xeon® processor or a reduced-instruction processor (e.g., a reduced instruction set computer (RISC) or an Advanced RISC Machine (ARM) processor) that may manage a data processing requests for the data processing system 10 (e.g., to perform machine learning, video processing, voice recognition, image recognition, data compression, database search ranking, bioinformatics, network security pattern identification, spatial navigation, or the like).

The host processor(s) 14 may communicate with the memory and/or storage circuitry 16, which may include a tangible, non-transitory, machine-readable-medium, such as random-access memory (RAM), read-only memory (ROM), one or more hard drives, flash memory, or any other suitable optical, magnetic or solid-state storage medium. The memory and/or storage circuitry 16 may store data to be processed by the data processing system 10, such as processor-executable control software, configuration software, system parameters, configuration data, etc.

The data processing system 10 may also include a network interface 18 that enables the data processing system 10 to communicate with other electronic devices. In some embodiments, the data processing system 10 may be part of a data center that processes a variety of different requests. For instance, the data processing system 10 may receive a data processing request via the network interface 18 to perform machine learning, video processing, voice recognition, image recognition, data compression, database search ranking, bioinformatics processes, network security pattern identification, spatial navigation, or other specialized tasks. The data processing system 10 may further include the integrated circuit device 12 that facilitates performs data processing tasks.

Figure 2:
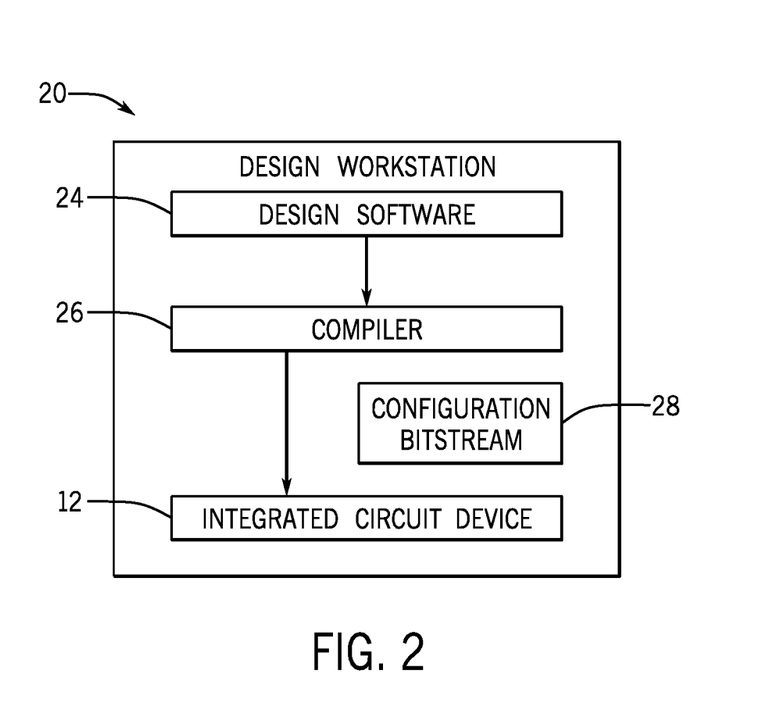
FIG. 2 is a block diagram of a design workstation that may facilitate programming of the integrated circuit device of FIG. 1, according to embodiments of the present disclosure.

A designer may use a design workstation 20 to develop a design that may be implemented by and/or configure the integrated circuit device 12, as shown in FIG. 2, according to embodiments of the present disclosure. In some embodiments, the designer may use design software 24 (e.g., Intel® Quartus® by INTEL CORPORATION) to generate a design that may be used to program (e.g., configure) the integrated circuit device 12. For example, a designer may program a modularized integrated circuit device 12 to implement specific functionality, such as implementing a circuit design (e.g., higher-level circuit design), as if the integrated circuit device 12 were monolithic. The integrated circuit device 12 may be a programmable integrated circuit, such as a field-programmable gate array (FPGA), that includes one or more programmable fabric dies, which together may implement one or more circuit designs. Each programmable fabric die may also include one or more input/output (I/O) interfaces (e.g., microbumps and/or associated transmission, receiving, driving, and/or routing components) that enable the programmable fabric die to communicate with other devices or components (e.g., internal or external to the integrated circuit device 12).

As such, the design software 24 may use a compiler 26 to generate a lower-level circuit-design configuration for the integrated circuit device 12. That is, the compiler 26 may provide machine-readable instructions representative of the designer-specified functionality to the integrated circuit device 12, for example, in the form of a configuration bitstream 28. The host processor(s) 14 may coordinate the loading of the bitstream 28 onto the integrated circuit device 12 and subsequent programming of the programmable fabric.

Figure 3:
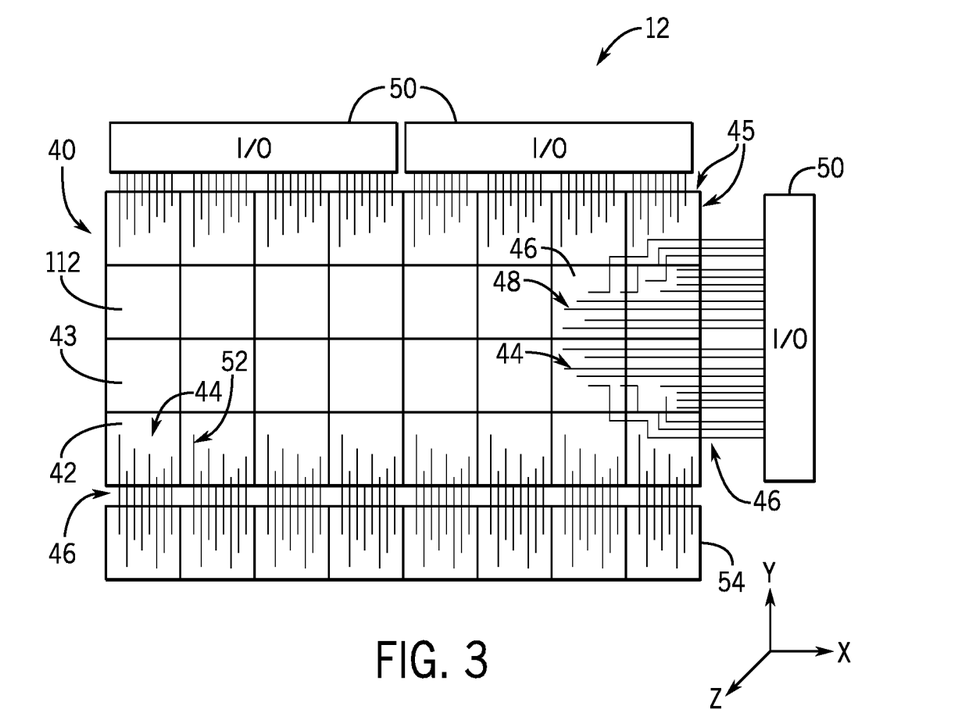
FIG. 3 is a schematic diagram of a top view of a portion of the integrated circuit device of FIG. 1 that includes a programmable fabric die, according to embodiments of the present disclosure.

FIG. 3 is a schematic diagram of a top view of a portion of the integrated circuit device 12 of FIG. 1 that includes the programmable fabric die 40, according to embodiments of the present disclosure. The programmable fabric die 40 may include the programmable logic fabric 43, which may be divided into one or more sectors 42 that each include programmable logic fabric 43 (also referred to as "programmable fabric", "programmable logic", "programmable fabric circuitry", "programmable logic circuitry", and so on). The programmable logic fabric 43 may be arranged in groups that are sometimes referred to as configurable logic blocks (CLBs), logic array blocks (LABs), or logic element blocks (LE blocks). The programmable logic fabric 43 may also include memory LABs (MLABs), DSP blocks, routing multiplexers, and so on. The programmable logic fabric 43 may receive the configuration bitstream 28 from the host processor(s) 14, store the configuration bitstream 28 in configuration random access memory (CRAM) bits of the integrated circuit device 12, and may be configured according to the circuit design embodied in the configuration bitstream 28 stored in the CRAM bits. The programmable fabric die 40 may be configured or partially configured at run-time and/or may be re-configured or partially re-configured at a later time, enabling design flexibility post-manufacturing.

As illustrated, multiple sectors (e.g., including sector 42) of the programmable fabric die 40 may each include multiple I/O interfaces 44 that enable the respective sectors 42 to communicatively couple to components or devices external to the programmable fabric die 40. Each I/O interface 44 may be in the form of a driver, buffer, and/or pin, and be communicatively coupled to a component or device external to the programmable fabric die 40 via a wire or conductor 47, and send information to or receive information from the component or device via the wire 47. For example, as illustrated, an I/O interface 48 is communicatively coupled to an I/O block 50 of the integrated circuit device 12, and may send information to or receive information from the I/O block 50. The I/O block 50 may be communicatively coupled to, for example, devices that are external to the integrated circuit device 12. In this manner, the programmable fabric die 40 may send information to or receive information from devices that are external to the integrated circuit device 12.

Similarly, and also illustrated, an I/O interface 52 is communicatively coupled to another programmable fabric die 54 of the integrated circuit device 12, and may send information to or receive information from the other programmable fabric die 55. The multiple I/O interfaces 44 of each sector 42 are shown to be spread out or distributed across each sector 42 (rather than aggregated or concentrated in a single region or column of the sector 42), and, as such, are also spread out or distributed across the programmable logic fabric 43 of the programmable fabric die 40. Additionally, the I/O interfaces 44 may be disposed sectors 42 located on the edge 45 of the programmable fabric die 40, or sectors 46 located away from the edge 45 of the programmable fabric die 40. As such, I/O interfaces 44 may couple to devices disposed on any side of the programmable fabric die 40. Although the integrated circuit device 12 is shown as an FPGA, it should be appreciated that I/O interfaces 44 may be distributed across any suitable type of integrated circuit device 12.

Figure 4:
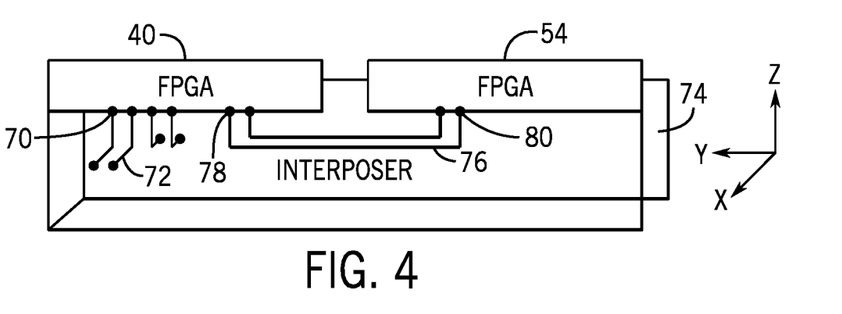
FIG. 4 is a schematic diagram of a side view of the programmable fabric die of FIG. 3 electrically coupled to a second programmable fabric die, according to embodiments of the present disclosure.

FIG. 4 is a schematic diagram of a side view of the programmable fabric die 40 of FIG. 3 electrically coupled to a second programmable fabric die 54, according to embodiments of the present disclosure. As illustrated, the programmable fabric die 40 (e.g., shown as a field-programmable gate array) may include microbumps 70 disposed on a bottom surface. Each I/O interface 44 (e.g., shown in FIG. 3) may be electrically coupled to a respective microbump 70 (e.g., via the wire 47 within the programmable fabric die 40). The microbump 70 may be electrically coupled to another wire or conductor 72 disposed at least in part in a silicon interposer 74 (e.g., passive interposer). The interposer 74 may in turn be supported by a package substrate, which facilitates electrical connections of the integrated circuit device 12. While the interposer 74 is described as a passive interposer in the present disclosure, the interposer 74 may also or alternatively contain active components and/or may be an active interposer.

The wire 72 may electrically couple to another microbump of a component or device external to the programmable fabric die 40. For example, a wire 76 electrically coupled to a first microbump 78 of the programmable fabric die 40 may also electrically couple to a second microbump 80 of the second programmable fabric die 54 through the interposer 74. As illustrated, the first and second programmable fabric dies 40, 54 may be disposed on the interposer 74. In this manner, the programmable fabric die 40 and the second programmable fabric die 54 may send and receive information to and from one another.

Figure 5:
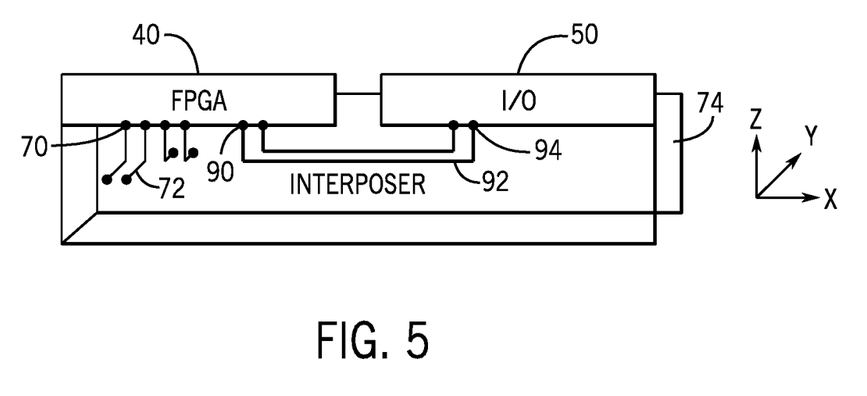
FIG. 5 is a schematic diagram of a side view of the programmable fabric die of FIG. 3 electrically coupled to an I/O block, according to embodiments of the present disclosure.

Similarly, FIG. 5 is a schematic diagram of a side view of the programmable fabric die 40 of FIG. 3 electrically coupled to an I/O block 50, according to embodiments of the present disclosure. As illustrated, a first microbump 90 of the programmable fabric die 40 may be electrically coupled to the wire 92 disposed at least in part in the interposer 74. The wire 92 may also electrically couple to a second microbump 94 of the I/O block 50 through the interposer 74. As illustrated, the first programmable fabric die 40 and the I/O block 50 may be disposed on the interposer 74. In this manner, the programmable fabric die 40 and the I/O block 50 may send and receive information to and from one another. Additionally, the I/O block 50 may send and receive the information to and from devices that are external to the integrated circuit device 12.

Figure 6:
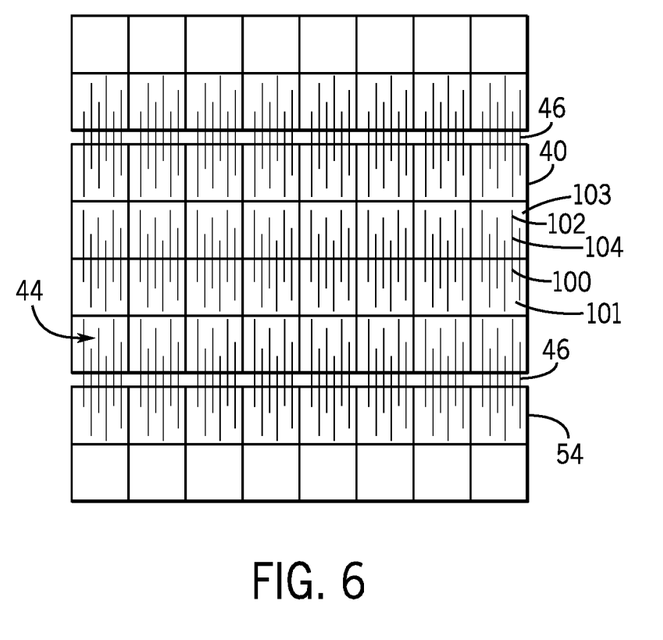
FIG. 6 is a schematic diagram of a top view of the programmable fabric die of FIG. 3 that uses I/O interfaces to electrically couple a first portion of the programmable fabric die to a second portion of the programmable fabric die, according to embodiments of the present disclosure

In some embodiments, I/O interfaces 44 may be used to connect a first portion of the programmable fabric die 40 with a second portion of the same programmable fabric die 40. For example, FIG. 6 is a schematic diagram of a top view of the programmable fabric die 40 of FIG. 3 that uses I/O interfaces 44 to electrically couple a first portion of the programmable fabric die 40 to a second portion of the programmable fabric die 40, according to embodiments of the present disclosure. In particular, a first I/O interface 100 of a first sector 101 of the programmable fabric die 40 is electrically coupled to a second I/O interface 102 of a second sector 103 of the programmable fabric die 40 via a wire or conductor 104. As is the case with the second programmable fabric die 54 of FIG. 4 and the I/O block 50 of FIG. 5, the wire 104 may couple a first microbump of the programmable fabric die 40 to a second microbump of the second programmable fabric die 54 through the interposer 74. Advantageously, wires or tracks in the interposer may enable faster transmission speed or bandwidth compared to wires in the programmable fabric die 40. Moreover, offloading signal routing into the interposer 74 may reduce or free up signal congestion in the programmable fabric die 40.

Figure 7:
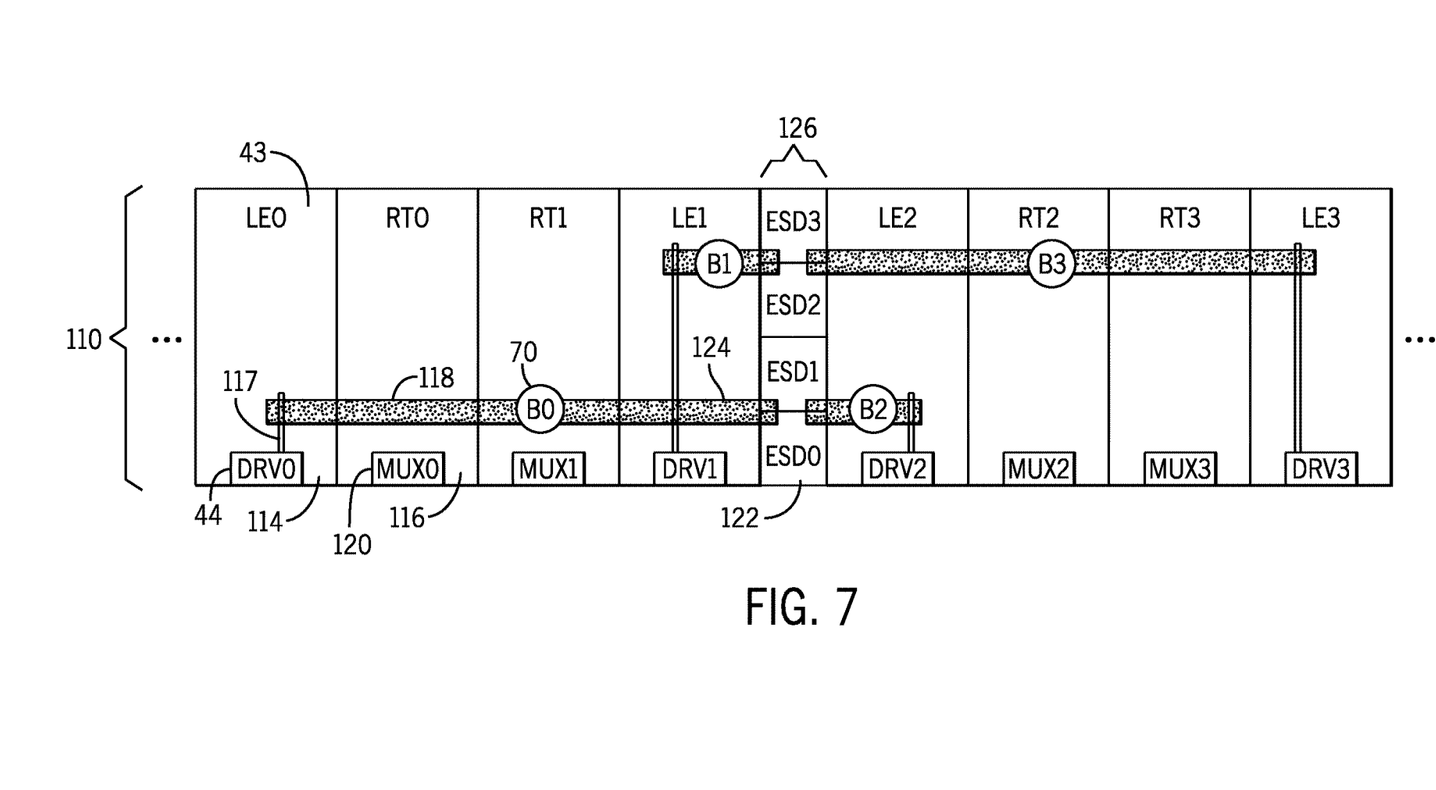
FIG. 7 is a block diagram of a row of a sector of the programmable fabric die of FIG. 3, according to embodiments of the present disclosure.

FIG. 7 is a block diagram of a row 110 of a sector 112 of the programmable fabric die 40 of FIG. 3, according to embodiments of the present disclosure. Each sector 112 may include one or more rows 110, such as 43 rows, of components that facilitate processing and routing of data. As illustrated, the row 110 includes various logic array blocks (LABs), such as logic element (LE) blocks 114 (e.g., LE0, LE1, LE2, LE3, . . . LEn) that may provide programmable functionality. In particular, the LE block 114 may implement logic functions, arithmetic functions, register functions, and so on, based on the circuit design implemented (e.g., in the form of a bitstream programmed in configuration random access memory (CRAM) bits of the integrated circuit device 12 corresponding to the LE block 114). The sector 112 may also include routing circuitry (RT) blocks 116 that may include programmable routing fabric and route received signals between other blocks (including the LE blocks 114). While not illustrated, the sector 112 may additionally or alternatively include any other suitable blocks or components that facilitate operation of the programmable fabric die 40, including digital signal processing (DSP) blocks, logic element input multiplexer (LEIM) blocks, other LABs, and so on.

As illustrated, each LE block 114 includes an I/O interface 44 (e.g., DRV0, DRV1, DRV2, DRV3, . . . DRVn), as opposed to grouping multiple I/O interfaces 44 into one block of the row 110. The I/O interface 44s may be positioned in the LE blocks 114 to reduce or minimize intrusive as to avoid interfering with routing in the LE blocks 114. Each I/O interface 44 may be electrically coupled to a respective microbump 70 via vertical wires 117 and/or horizontal wires 118. In some embodiments, each of the I/O interface 44s, the vertical wires 117, and/or the horizontal wires 118 may be disposed on a separate layer (e.g., the vertical wires 117 may be disposed on a first metal layer of the programmable fabric die 40, while the horizontal wires 118 may be disposed on a second metal layer). As illustrated, an I/O interface 44 and a coupled microbump 70 may also be disposed on separate layers. For example, the I/O interface 44 is disposed in LE block 114 LE0, and as such, the same layer as the programmable logic fabric 43 of the LE0, while the microbump 70 B0 coupled to the I/O interface 44 may disposed in a different layer (e.g., in a bottom layer in contact with the interposer 74). The microbump 70 may also be electrically coupled to an external device via a wire 76, such as a second programmable fabric die 54 or an I/O block 50.

As such, each I/O interface 44 may be distributed throughout programmable logic fabric 43 of the programmable fabric die 40 (and thus distributed throughout the integrated circuit device 12), have direct access to distributed fabric routing (e.g., in LE blocks 114 and/or RT blocks 116), and connect directly to distributed microbumps 70 and wires 76, 92 (e.g., tracks) in the interposer 74. These distributed I/O interfaces 44 may be more tightly integrated into programmable logic fabric 43 and/or fabric resources of the programmable fabric die 40 compared to clustered or columnar groups of I/O interfaces. Thus, wires 47 of the programmable logic fabric 43 may connect directly to I/O interfaces 44 anywhere in the programmable logic fabric 43, resulting in less on-die routing (e.g., that may have been used to route signals to remotely located columns or clusters of I/O interfaces), improving on-die routing power and delay, and reducing on-die congestion (e.g., of both wiring and signal transfer components as well as signals). Moreover, power and delay used to send signals into the interposer 74 may also be reduced since the distributed I/O interfaces 44 may connect directly to microbumps 70 and wires 76, 92 in the interposer 74. It should be understood that use of the phrase "direct connection" in this disclosure may indicate that a connection is made without using network-based communication.

Each RT block 116 may include a multiplexer block 120 (e.g., MUX0, MUX1, MUX2, MUX3, . . . MUXn), which may provide connections to and/or from the programmable routing fabric of a respective RT block 116. Placing the multiplexer block 120 within or close to a respective RT block 116 may reduce or minimize connection length and delay associated with transmitting signals or data to or from the programmable routing fabric of the respective RT block 116 via the multiplexer block 120. Conveniently, the multiplexer block 120 may use or borrow control logic (e.g., clock components or signals, synchronization registers, and so on) from the respective RT block 116 since the multiplexer block 120 and the RT block 116 may use the same clock signals.

Additionally, each microbump 70 may be electrically coupled to an electrostatic discharge (ESD) diode 122 (e.g., ESD0, ESD1, ESD2, ESD3, . . . ESDn) via a horizontal wire 124. The ESD diode 122 may protect components of the programmable fabric die 40 from electrostatic discharge by absorbing a sudden flow of static electricity (e.g., caused by contact, an electrical short, dielectric breakdown, and so on). In some embodiments, the ESD diodes 122 may be disposed in a configuration to reduce or minimize intrusive as to avoid interfering with LAB routing, such as in a dedicated column 126.

Figure 8:
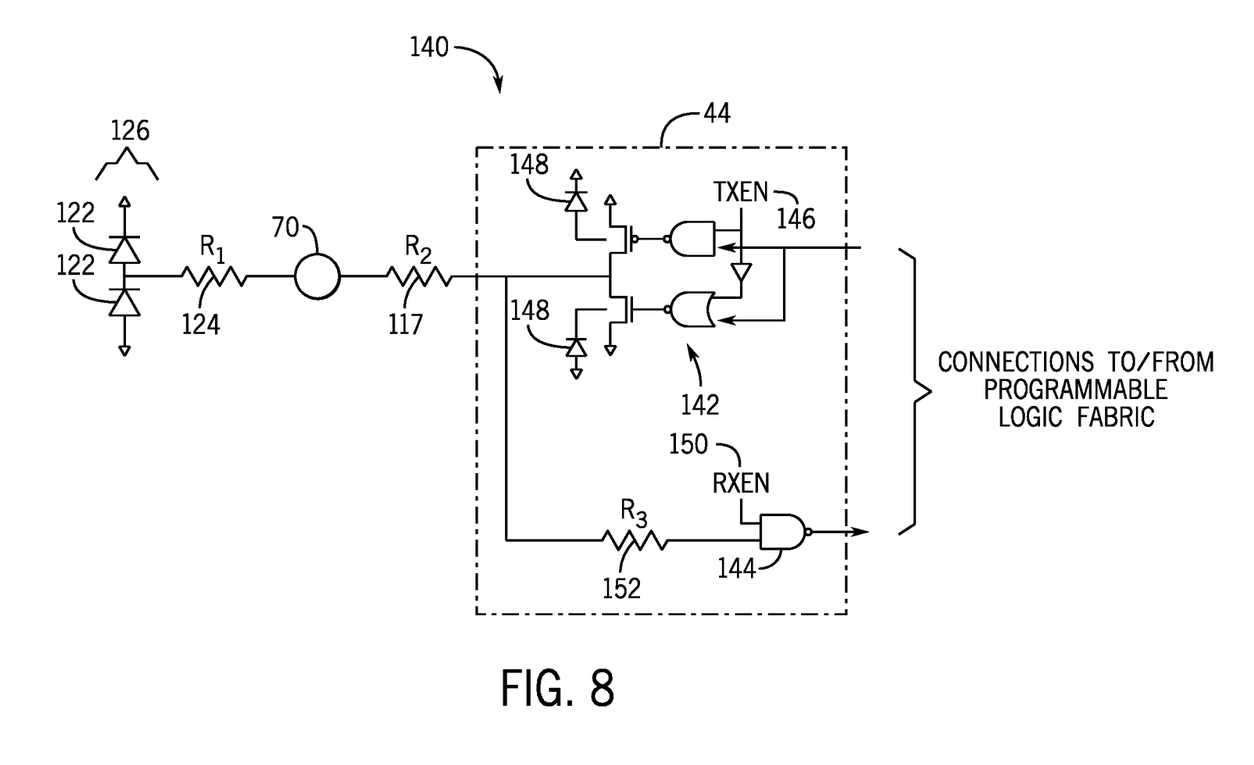
FIG. 8 is a circuit diagram of an example electrostatic discharge protection system of the programmable fabric die of FIG. 3, according to embodiments of the present disclosure.

The ESD diodes 122 may directly connect to microbumps 70 with reduced or minimum impedance, while I/O interfaces 44 may connect with slightly larger impedance—which may improve ESD protection for a small performance cost. For example, FIG. 8 is a circuit diagram of an example ESD protection system 140 of the programmable fabric die 40 of FIG. 3, according to embodiments of the present disclosure. As illustrated, the ESD diodes 122 may be aligned or disposed in a dedicated column 126, though in additional or alternative embodiments, the ESD diodes 122 may be aligned or disposed in multiple dedicated columns 126. An ESD diode 122 may be electrically coupled to a microbump 70 via a wire or conductor, such as a horizontal wire 118. The resistance of the connection or wire 118 between the ESD diode 122 and the microbump 70 may be represented by the resistor $R_1$. The microbump 70 may also be electrically coupled to an I/O interface 44 via a wire or conductor, such as at least a vertical wire 117. The resistance of the connection or wire 117 between the microbump 70 and the I/O interface 44 may be represented by the resistor $R_2$.

The I/O interface 44 may include transmission logic 142 and receive logic 144. The transmission logic 142 may enable programmable logic fabric 43 (e.g., logic elements such as digital signal processing (DSP) blocks, routing multiplexers (muxes), and so on) of the LE block 114 that includes the I/O interface 44 to transmit signals to the microbump 70. The transmission logic 142 may be enabled or disabled (thus enabling or disabling the programmable logic fabric 43 of the LE block 114 from transmitting signals to the microbump 70) based on receiving a transmission enable (TXEN) signal 146. In some embodiments, the transmission logic 142 may include additional ESD protection by using bulk diodes 148 of large transistor devices. The bulk diodes 148 may be an intrinsic characteristic of the large transistor devices that make up the I/O interface 48. Because the transmission logic 142 is disposed in LE blocks 114 having logic elements, the transmission logic 142 may tap the programmable logic fabric 43 of the LE block 114 with reduced or minimal added interconnect. The term "logic" as used herein may refer to hardware (e.g., circuitry), software (e.g., machine-readable instructions), or a combination of the two.

The receive logic 144 may enable the programmable logic fabric 43 of the LE block 114 that includes the I/O interface 44 to receive signals from the microbump 70. The receive logic 144 may be enabled or disabled (thus enabling or disabling the programmable logic fabric 43 of the LE block 114 from receiving signals from the microbump 70) based on receiving a receive (RXEN) signal 150. In some embodiments, the receive logic 144 may be electrically coupled to the microbump 70 via a resistor 152 or a wire having a resistance of $R_3$. To improve ESD protection, the ESD diodes 122 may directly connect to the microbumps 70 with a low or minimum impedance that is less than the impedance that the I/O interfaces 44 connect to the microbumps 70. That is, the ESD protection system 140 of FIG. 8 may be implemented to have effective or improved ESD protection by ensuring that $R_1 < R_2 \ll R_3$.

For each ESD protection system 140, this relationship may be achieved based on the distance between the ESD diode(s) 122 and the microbump 70, the distance between the microbump 70 and the receive logic 144, the thickness of the metal tracks coupling the ESD diode(s) 122 and the microbump 70, and the thickness of the metal tracks coupling the microbump 70 and the receive logic 144. In particular, ensuring that the distance between the ESD diode(s) 122 and the microbump 70 is less (e.g., closer) than the distance between the microbump 70 and the receive logic 144 may facilitate realizing the relationship. Similarly, ensuring that the thickness of the metal tracks coupling the ESD diode(s) 122 and the microbump 70 is greater (e.g., thicker) than and the thickness of the metal tracks coupling the microbump 70 and the receive logic 144 may facilitate realizing the relationship. As such, the ESD protection system 140 may be designed with a combination of ensuring that the distance between the ESD diode(s) 122 and the microbump 70 is less than the distance between the microbump 70 and the receive logic 144, and ensuring that the thickness of the metal tracks coupling the ESD diode(s) 122 and the microbump 70 is greater than and the thickness of the metal tracks coupling the microbump 70 and the receive logic 144 to ensure that $R_1 < R_2 << R_3$, as referenced in FIG. 8.

The transmission logic 142 and the receive logic 144 may also be electrically coupled to the programmable logic fabric 43 of the LE block 114 that includes the I/O interface 44. The microbump 70 may be electrically coupled to a device external to the programmable fabric die 40, such as a second programmable fabric die 54 or an I/O block 50. In this manner, the receiving and transmission connections of the I/O interface 44 and the overall topology of the programmable fabric die 40 may be designed and/or optimized for increased or maximum ESD protection, even with ESD diodes 122 disposed in a separate column 126. Moreover, distributing the I/O interfaces 44 across programmable logic fabric 43 of the programmable fabric die 40 may provide more design flexibility (e.g., compared to clustered or columnar groupings of I/O interfaces 44). Larger scale structures, such as the I/O interfaces 44, the ESD diodes 122, and so on, may be placed where convenient (e.g., where there is free or dead space and/or where metal blockages are less or least intrusive). Input and output routing may be configured or routed to connect to programmable routing fabric (e.g., of the RT blocks 116) to reduce or minimize fabric congestion and increase or maximize performance.

The distributed I/O interfaces 44 may be integrated into a repairable fabric of the programmable fabric die 40, and support independent repair (e.g., decoupling a repair location of the repairable fabric from a repair location of an I/O interface 44) with reduced or minimal hardware overhead. This may be particularly useful since fabric repair decisions are often made on a single die (and thus often right after the die is manufactured, whereas I/O faults may often only be observable after assembly of a multi-die system. The I/O faults may thus be repaired after assembly of the multi-die system, which may avoid the high cost of multi-die system loss.

Figure 9:
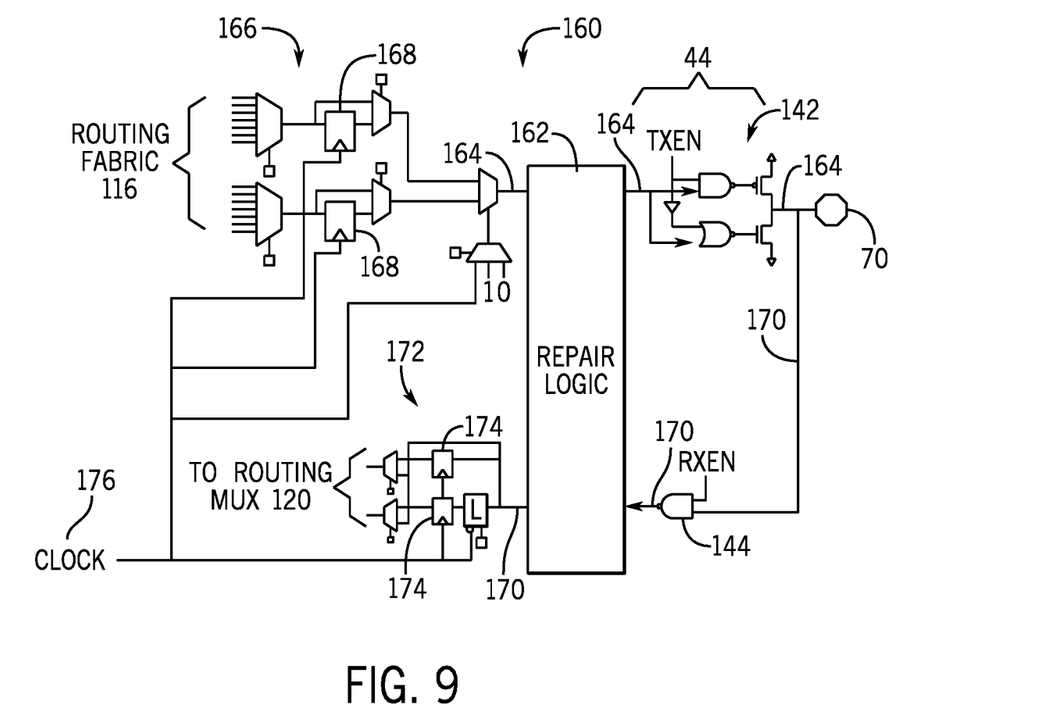
FIG. 9 is a circuit diagram of an example repair system of the programmable fabric die of FIG. 3, according to embodiments of the present disclosure.

FIG. 9 is a circuit diagram of an example repair system 160 of the programmable fabric die 40 of FIG. 3, according to embodiments of the present disclosure. As illustrated, repair logic 162 that may repair a row 110 of programmable logic fabric 43 of a sector 112 of the programmable fabric die 40 and/or a microbump 70 of the programmable fabric die 40 is disposed in between the programmable logic fabric 43 and the microbump 70. In the case of the programmable fabric die 40 transmitting an outgoing signal 164 to an external device (e.g., a second programmable fabric die 54 or an I/O block 50), the repair logic 162 may receive the outgoing signal 164 from output routing interface logic 166 of the programmable fabric die 40, which may include one or more flip-flops 168 used to store data associated with the outgoing signal 164. The output routing interface logic 166 may in turn receive or generate the outgoing signal 164 from, for example, routing fabric of an RT block 116 (e.g., which may receive the outgoing signal 164 from a row 110 of programmable logic fabric 43 of an LE block 114) of the programmable fabric die 40. The repair logic 162 may forward the outgoing signal 164 to transmission logic 142, which may transmit the outgoing signal 164 to the microbump 70. The microbump 70 may then transmit the outgoing signal 164 to the external device.

In the case of the programmable fabric die 40 receiving an incoming signal 170 from an external device (e.g., a second programmable fabric die 54 or an I/O block 50), receive logic 144 may receive the incoming signal 170 from the microbump 70, which may then send the incoming signal 170 to the repair logic 162. The repair logic 162 may forward the incoming signal 170 to input routing interface logic 172 of the programmable fabric die 40, which may include one or more flip-flops 174 used to store data associated with the incoming signal 170. The input routing interface logic 172 may then send the incoming signal 170 to, for example, multiplexer blocks 120 of an RT block 116 (e.g., which may send the incoming signal 170 to a row 110 of programmable logic fabric 43 of an LE block 114) of the programmable fabric die 40. In some embodiments, both the input and output routing interface logic 172, 166 may use one or more clock signals 176 provided from the programmable fabric die 40.

To repair a faulty row 110 of programmable logic fabric 43 of an LE block 114, the repair logic 162 may swap or replace the faulty row 110 with a spare, working row 110 of the LE block 114. In particular, the repair logic 162 may remap the faulty row 110 with the spare row 110, such that an outgoing signal 164 intended to be received from the faulty row 110 may instead be received from the spare row 110, and an incoming signal 170 intended to be sent to the faulty row 110 may instead be sent to the spare row 110. Similarly, to repair a faulty I/O interface 44 of the programmable fabric die 40, the repair logic 162 may swap or replace the faulty I/O interface 44 with a spare, working I/O interface 44. In particular, the repair logic 162 may remap the faulty I/O interface 44 with the spare I/O interface 44, such that an incoming signal 170 intended to be received from the faulty I/O interface 44 may instead be received from the spare I/O interface 44, and an outgoing signal 164 intended to be sent to the faulty I/O interface 44 may instead be sent to the spare I/O interface 44.

Figure 10:
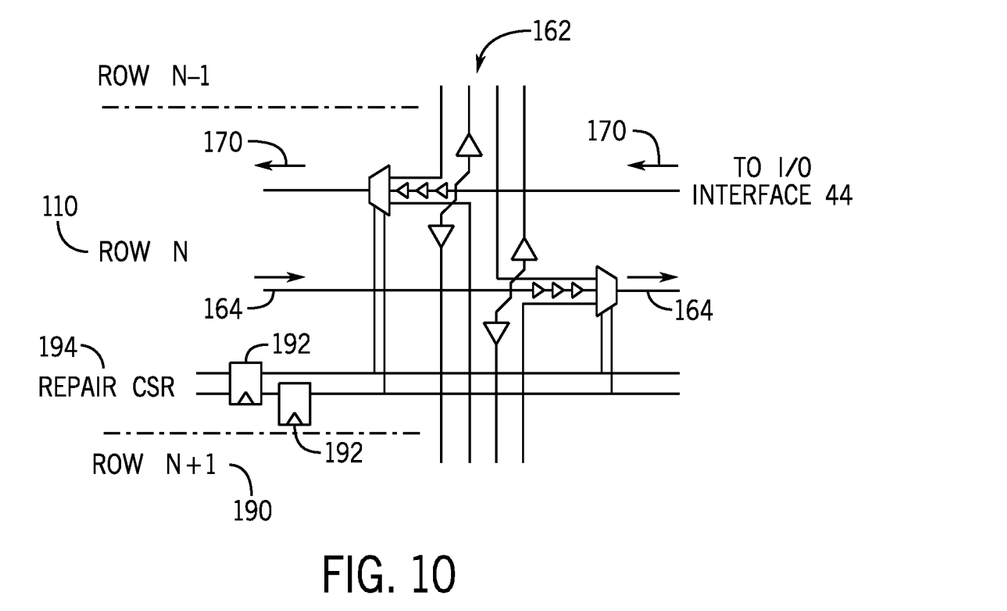
FIG. 10 is a circuit diagram of repair logic of the example repair system of FIG. 9, according to embodiments of the present disclosure.

FIG. 10 is a circuit diagram of the repair logic 162 of FIG. 9 for a row 110 (e.g., Row N) of an LE block 114 and an I/O interface 44, according to embodiments of the present disclosure. As illustrated, when Row N is operating correctly (e.g., when Row N is not faulty) and when the I/O interface 44 is operating correctly (e.g., when I/O interface 44 is not faulty), Row N may receive incoming signals 170 from the I/O interface 44, and Row N may send outgoing signals 164 to the I/O interface 44. However, when Row N becomes faulty (e.g., Row N does not operate as configured according to the circuit design embodied in the configuration bitstream 28 stored in the CRAM bits), then the repair logic 162 may swap Row N with a spare, working row 110, such as Row N+1 190, by activating programmable links 192 (e.g., fuses, antifuses, or any other suitable programmable circuitry that reroutes circuit paths) to electrically disconnect or decouple Row N from the I/O interface 44 and electrically connect or couple Row N+1 to the I/O interface 44. Similarly, when the I/O interface 44 becomes faulty (e.g., the I/O interface 44 does not transfer signals between Row N and a microbump 70), then the repair logic 162 may swap the I/O interface 44 with a spare, working I/O interface 44 by activating the programmable links 192 to electrically disconnect or decouple the I/O interface 44 from Row N and electrically connect or couple the working I/O interface 44 to Row N. A repair configuration shift register (CSR) 194 may control operation of the programmable links 192.

Figure 11:
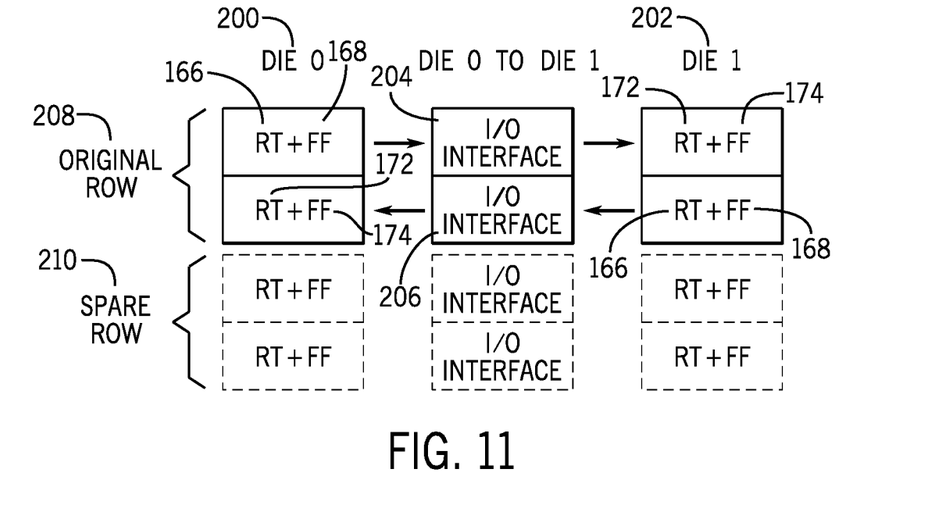
FIG. 11 is a flow diagram of first and second programmable fabric dies electrically coupled together by two I/O interfaces, according to embodiments of the present disclosure.

In this manner, if more than one I/O interface 44 is included in a region (e.g., an LE block 114), the I/O interface 44 may be repaired with low incremental cost (e.g., without having to replace or disable the entire region or LE block 114). For example, FIG. 11 is a flow diagram of first and second programmable fabric dies 200, 202 electrically coupled together by two I/O interfaces 204, 206, according to embodiments of the present disclosure. As such, each of the depicted I/O interfaces (e.g., 204, 206) if FIGS. 11-13 may represent an I/O interface 44 disposed on the first programmable fabric die 200, an I/O interface 44 disposed on the second programmable fabric die 202, and a microbump 70 electrically coupling the I/O interface 44 of the first programmable fabric die 200 to the I/O interface 44 of the second programmable fabric die 202.

As illustrated, the output routing interface logic 166 and associated flip-flops 168 of an original row 208 of the first programmable fabric die 200 are electrically coupled to the first I/O interface 204, which is in turn electrically coupled to the input routing interface logic 172 and associated flip-flops 174 of an original row 208 of the second programmable fabric die 202. As such, outgoing signals may be sent from the first programmable fabric die 200 to the second programmable fabric die 202 via the first I/O interface 204. Additionally, the output routing interface logic 166 and associated flip-flops 168 of the original row 208 of the second programmable fabric die 202 are electrically coupled to the second I/O interface 206, which is in turn electrically coupled to the input routing interface logic 172 and associated flip-flops 174 of the original row 208 of the second programmable fabric die 202. As such, incoming signals may be sent from the second programmable fabric die 202 to the first programmable fabric die 200 via the second I/O interface 206.

As illustrated, the first and second programmable fabric dies 200, 202 each may include a spare row 210 to be activated when the original row 208 is determined to be faulty. Similarly, the I/O interfaces 204, 206 each include spare components 210 that may be activated when the original I/O interfaces 204, 206 are determined to be faulty. For example, after a multi-die system is assembled (e.g., in a manufacturing facility) as an integrated circuit device 12, the integrated circuit device 12 may be tested (e.g., by an external testing device) to determine if any components (e.g., rows of programmable logic fabric 43, I/O interfaces 44, and so on) are faulty. If so, the components may be repaired by remapping to a spare, working component (e.g., prior to implementing a circuit design embodied in the configuration bitstream 28 stored in the CRAM bits). In additional or alternative embodiments, the repair may be done while the integrated circuit device 12 is in user mode. That is, a built-in "self-test" may be performed (e.g., by a user via an external testing device, the host processor 14 of the data processing system 10 having the integrated circuit device 12, instructions in the configuration bitstream 28 stored in CRAM bits of the integrated circuit device 12, and so on) on the integrated circuit device 12 to determine whether there are faulty components. If so, the components may be repaired using built-in functionality of the integrated circuit device 12, implementing a circuit design that remaps functionality of the faulty components to spare, working components (e.g., that is stored in CRAM bits of the integrated circuit device 12), and so on. As such, the repair logic 162 may enable users to repair components of an integrated circuit device 12 on-the-fly (e.g., after the integrated circuit device 12 has left a manufacturing facility and as part of user-programmed logic).

Figure 12:
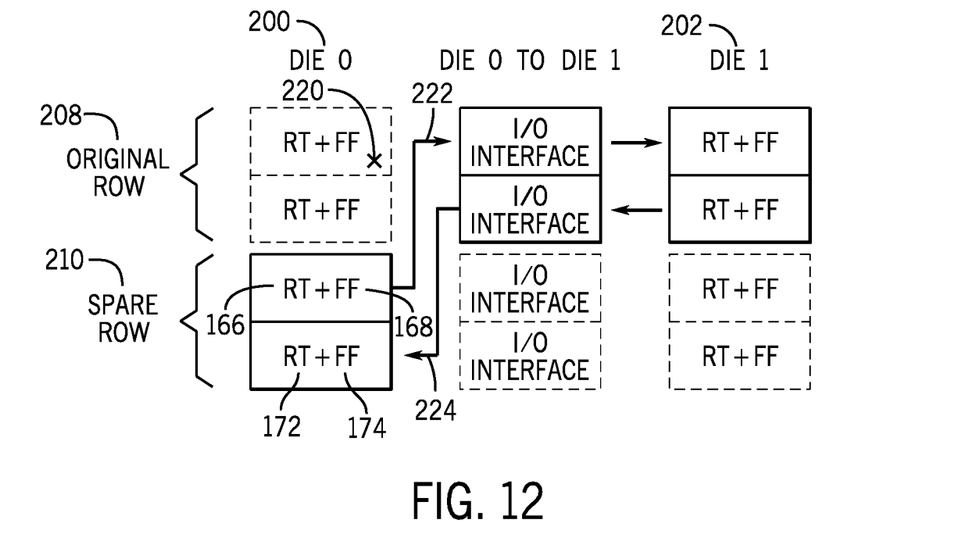
FIG. 12 is a flow diagram of the first programmable fabric die of FIG. 11 using a spare row, according to embodiments of the present disclosure.

For example, FIG. 12 is a flow diagram of the first programmable fabric die 200 of FIG. 11 using the spare row 210, according to embodiments of the present disclosure. In particular, the original row 208 of output routing interface logic 166 and associated flip-flops 168 of the first programmable fabric die 200 may be determined to be faulty 220. As such, the repair logic 162 may remap connections with the I/O interfaces 44 to the spare row 210. That is, the repair logic 162 may remap 222 a transmission connection with the original I/O interface 204 from the output routing interface logic 166 and associated flip-flops 168 of the original row 208 to output routing interface logic 166 and associated flip-flops 168 of the spare row 210. Additionally, because the output and input routing interface logics 166, 172 are closely tied together (e.g., signals or wires cross between the output and input routing interface logics 166, 172), the repair logic 162 may also remap 224 a receive connection with the original I/O interface 206 from the input routing interface logic 172 and associated flip-flops 174 of the original row 208 to output input routing interface logic 172 and associated flip-flops 174 of the spare row 210. In this manner, a faulty row (e.g., of output routing interface logic 166 and associated flip-flops 168) of a programmable fabric die 40 may be repaired by replacing it with a spare, working row.

Figure 13:
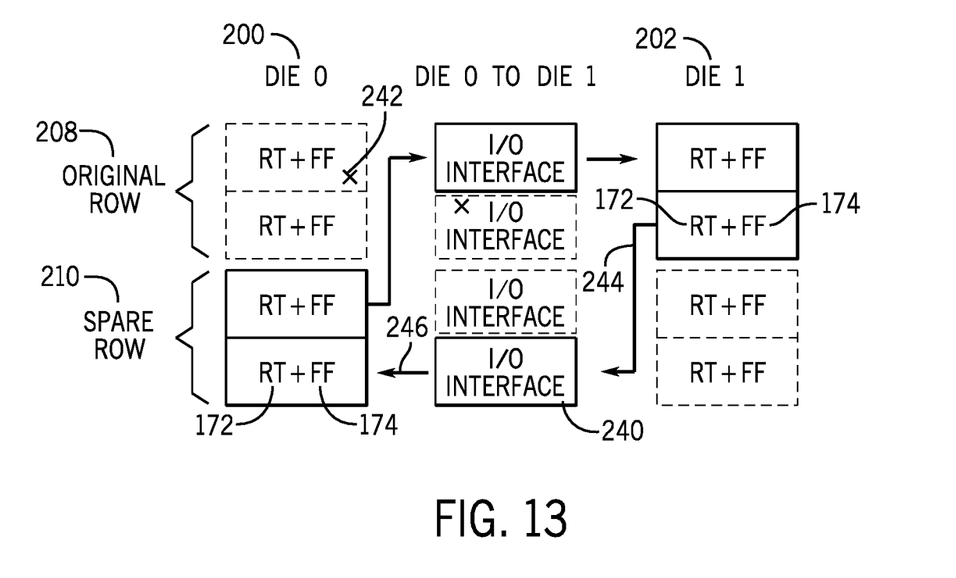
FIG. 13 is a flow diagram of the first and second programmable fabric dies of FIG. 12 using a spare I/O interface, according to embodiments of the present disclosure.

Unlike the routing interface logics 166, 172, which may not be swapped or rerouted independently due to being closely tied together, each I/O interface 44 may be swapped or rerouted independently if there is no communication (e.g., crossing signals or wires) between the I/O interfaces 44. For example, FIG. 13 is a flow diagram of the first and second programmable fabric dies 200, 202 of FIG. 12 using a spare I/O interface 240, according to embodiments of the present disclosure. In particular, the second I/O interface 206 of the original row 208 may be determined to be faulty 242. As such, the repair logic 162 may remap 244 connections with the second I/O interface 206 to the spare I/O interface 240. That is, the repair logic 162 may remap 244 a receive connection with the input routing interface logic 172 and associated flip-flops 174 of the second programmable fabric die 202 from the second I/O interface 206 of the original row 208 to the spare I/O interface 240. Additionally, the repair logic 162 may also remap 246 a receive connection with the input routing interface logic 172 and associated flip-flops 174 of the first programmable fabric die 200 from the second I/O interface 206 of the original row 208 to the spare I/O interface 240. Because the second I/O interface 206 is not closely tied with the first I/O interface 204 of the first programmable fabric die 200, the first I/O interface 204 may not need to be swapped or rerouted. In this manner, a faulty I/O interface 44 of a programmable fabric die 40 may be repaired independently from other I/O interfaces 44 in a region (e.g., in an LE block 114, RT block 116, and so on) by replacing it with a spare, working I/O interface 44.

Thus, information or signals to be sent to and from the I/O interfaces 44 may not need to first be sent to an aggregated I/O interface region, decreasing routing congestion in the programmable fabric die 40. Moreover, communication delay resulting from sending information or signals to or from portions of the programmable fabric die 40 that are located further away from the aggregated I/O interface region (e.g., on an edge or peripheral portion of the programmable fabric die 40) may be decreased or avoided entirely.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An integrated circuit device, comprising:
   an interposer;
   a programmable fabric die disposed on the interposer, wherein the programmable fabric die comprises a plurality of microbumps and a plurality of logic element blocks, wherein the plurality of logic element blocks comprises:
      programmable fabric circuitry; and
      a plurality of input/output interfaces distributed in the programmable fabric circuitry of the plurality of logic element blocks, wherein an input/output interface of the plurality of input/output interfaces distributed in a portion of programmable fabric circuitry of a logic element block of the plurality of logic element blocks is not disposed in a row with another input/output interface of the plurality of input/output interfaces in the portion of the programmable fabric circuitry of the logic element block and is not disposed in a column with another input/output interface of the plurality of input/output interfaces in the portion of the programmable fabric circuitry of the logic element block, and wherein the plurality of input/output interfaces is configured to electrically couple to the plurality of microbumps; and
   a device disposed on the interposer, wherein the device is external to the programmable fabric die and is configured to electrically couple to the plurality of microbumps via the interposer.

2. The integrated circuit device of claim 1, wherein the device comprises a second programmable fabric die.

3. The integrated circuit device of claim 1, wherein the device comprises an input/output block configured to communicatively couple to an external device, wherein the external device is external to the integrated circuit device.

4. The integrated circuit device of claim 1, wherein a first microbump of the plurality of microbumps is configured to electrically couple to a second microbump of the plurality of microbumps.

5. The integrated circuit device of claim 4, wherein the first microbump is configured to electrically couple to the second microbump via the interposer.

6. The integrated circuit device of claim 4, wherein the first microbump is configured to electrically couple to a first input/output interface of a first logic element block of the plurality of logic element blocks, wherein the second microbump is configured to electrically couple to a second input/output interface of a second logic element block of the plurality of logic element blocks.

7. The integrated circuit device of claim 6, wherein the programmable fabric die comprises a plurality of sectors, wherein a first sector of the plurality of sectors comprises the first logic element block, wherein a second sector of the plurality of sectors comprises the second logic element block.

8. The integrated circuit device of claim 1, wherein the programmable fabric die comprises a plurality of electrostatic discharge diodes, wherein the plurality of microbumps is configured to electrically couple to the plurality of electrostatic discharge diodes.

9. The integrated circuit device of claim 8, wherein the plurality of electrostatic discharge diodes is disposed in one or more columns.

10. A programmable fabric die comprising:
    a plurality of microbumps disposed on a bottom surface of the programmable fabric die;
    a plurality of logic element blocks comprising programmable fabric; and
    a plurality of input/output interfaces distributed in the programmable fabric, wherein an input/output interface of the plurality of input/output interfaces distributed in a portion of the programmable fabric of a logic element block of the plurality of logic element blocks is not aggregated with another input/output interface of the plurality of input/output interfaces in the portion of the programmable fabric of the logic element block, wherein the plurality of input/output interfaces is configured to electrically couple to the plurality of microbumps.

11. The programmable fabric die of claim 10, wherein a first microbump of the plurality of microbumps is configured to electrically couple to a second microbump of the plurality of microbumps.

12. The programmable fabric die of claim 11, wherein the first microbump is configured to electrically couple to the second microbump via one or more wires disposed in an interposer.

13. The programmable fabric die of claim 10, wherein a first microbump of the plurality of microbumps is configured to electrically couple to a second microbump of a second plurality of microbumps of a second programmable fabric die.

14. The programmable fabric die of claim 10, wherein a first microbump of the plurality of microbumps is configured to electrically couple to an input/output block, wherein the input/output block is configured to communicatively couple to an external device.

15. The programmable fabric die of claim 10, comprising a plurality of electrostatic discharge diodes, wherein the plurality of microbumps is electrically coupled to the plurality of electrostatic discharge diodes.

16. The programmable fabric die of claim 15, wherein the plurality of electrostatic discharge diodes is disposed in one or more columns.

17. A programmable fabric die comprising:
    a plurality of microbumps; and
    a plurality of sectors comprising a plurality of rows of logic element blocks, wherein the plurality of rows of logic element blocks comprises:
       programmable fabric circuitry;
       a plurality of input/output interfaces distributed in the plurality of rows of logic element blocks, wherein an input/output interface of the plurality of input/output interfaces distributed in a portion of the programmable fabric of a logic element block of the plurality of rows of logic element blocks is not aggregated with another input/output interface of the plurality of input/output interfaces in the portion of the programmable fabric of the logic element block, wherein the plurality of input/output interfaces is configured to electrically couple to the plurality of microbumps; and
       repair logic configured to reroute an incoming signal from a microbump of the plurality of microbumps to a second row of logic element blocks of the plurality of rows of logic element blocks when a first row of logic element blocks of the plurality of rows of logic element blocks is determined to be faulty.

18. The programmable fabric die of claim 17, wherein the repair logic is configured to reroute the incoming signal by remapping the first row of logic element blocks with the second row of logic element blocks.

19. The programmable fabric die of claim 18, wherein the repair logic comprises one or more fuses that are configured to remap the first row of logic element blocks with the second row by of logic element blocks disconnecting the first row of logic element blocks from the microbump and connecting the second row of logic element blocks to the microbump.

20. The programmable fabric die of claim 17, wherein the repair logic is configured to reroute an outgoing signal from the first row of logic element blocks to a second input/output interface of the plurality of input/output interfaces when a first input/output interface of the plurality of input/output interfaces is determined to be faulty.

21. The programmable fabric die of claim 20, wherein the repair logic is configured to reroute the outgoing signal by remapping the first input/output interface with the second input/output interface.

22. The programmable fabric die of claim 21, wherein the repair logic comprises one or more fuses that are configured to remap the first input/output interface with the second input/output interface by disconnecting the first input/output interface from a row of logic element blocks of the plurality of rows of logic element blocks and connecting the second input/output interface to the row of logic element blocks.

* * * * *